United States Patent [19]

Borghese

[11] Patent Number: 4,633,442
[45] Date of Patent: Dec. 30, 1986

[54] PROTECTIVE CIRCUITRY FOR A READ ONLY MEMORY

[75] Inventor: Michael N. Borghese, Framingham, Mass.

[73] Assignee: Raytheon Company, Lexington, Mass.

[21] Appl. No.: 697,992

[22] Filed: Feb. 4, 1985

[51] Int. Cl.$^4$ ............................................. G11C 7/00
[52] U.S. Cl. .................................... 365/203; 365/230
[58] Field of Search ................. 365/96, 203, 233, 230, 365/94, 104

[56] References Cited

U.S. PATENT DOCUMENTS 4,417,328  11/1983  Ochii .................................. 365/203
4,558,435  12/1985  Hsieh .................................. 365/203

Primary Examiner—Joseph A. Popek
Attorney, Agent, or Firm—Philip J. McFarland

[57] ABSTRACT

Protective circuitry for a monolithic ROM is shown to include six monolithic FETS interconnected so that two comprise a resistance-capacitance series circuit responsive to a biasing voltage applied thereto to produce a time-varying voltage and the remaining four monolithic FETS are interconnected to form a latching circuit having a "high" output when the time-varying voltage is below a predetermined level and a "low" output thereafter as long as the biasing voltage is applied.

2 Claims, 1 Drawing Figure

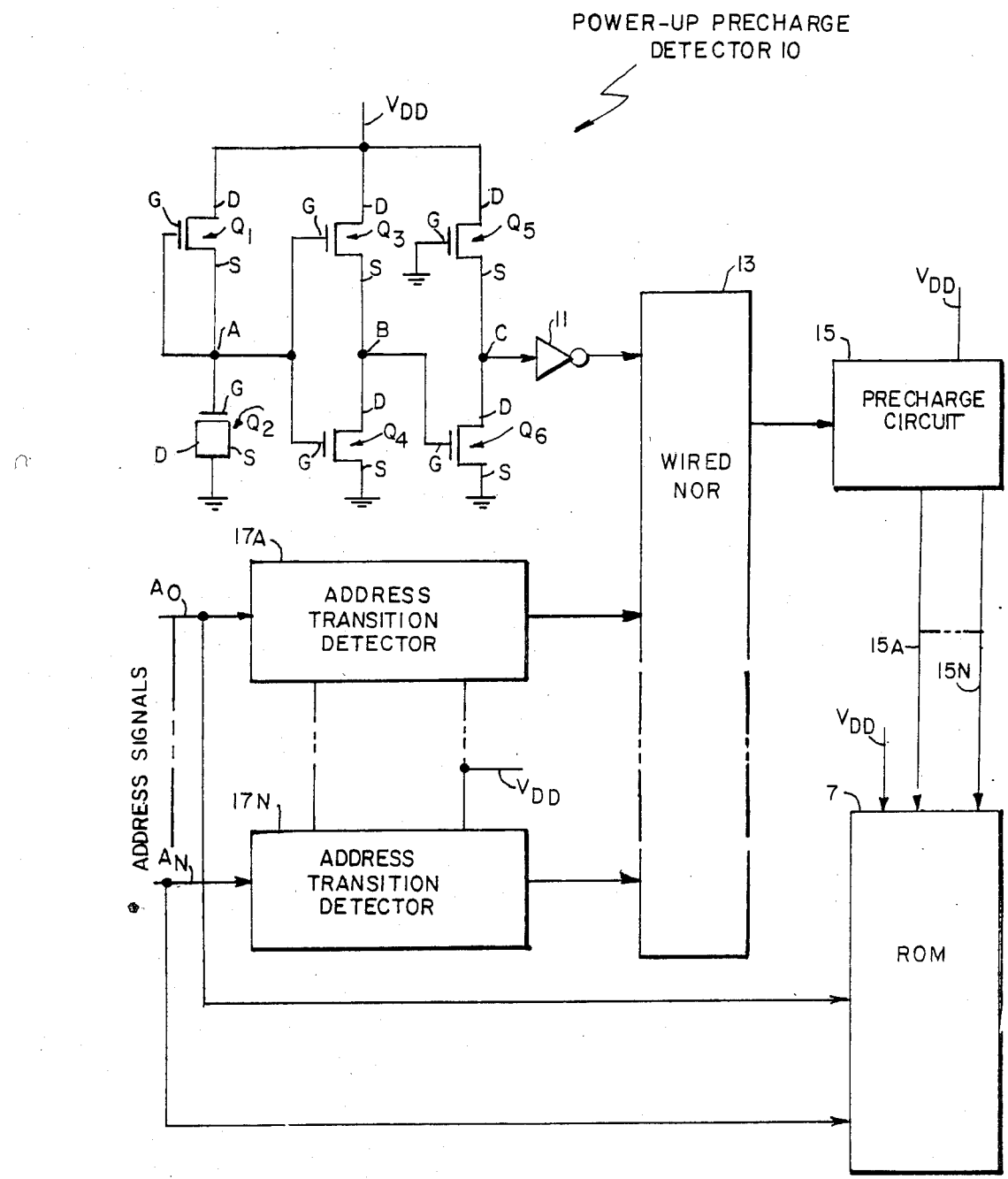

PROTECTIVE CIRCUITRY FOR A READ ONLY MEMORY

BACKGROUND OF THE INVENTION

This invention pertains generally to read only memories (ROM's) and particularly to an improved monolithic ROM wherein the possibility of false operation is reduced.

During normal operation of a monolithic ROM, the elements making up the ROM (such as address transition detectors, sense amplifiers, word decoders and storage latches) are biased so that any address applied to the ROM results in a desired output signal. However, at the moment the ROM is energized (and for a short time thereafter) the elements in a ROM may be so biased that, if an address change were not applied, a false output signal would be generated.

SUMMARY OF THE INVENTION

With the foregoing background of the invention in mind, it is a primary object of this invention to provide circuitry for incorporation in a monolithic ROM to prevent improper operation when such a ROM is first energized.

It is another object of this invention to provide circuitry for incorporation in a monolithic ROM to ensure that the elements within such a ROM are properly biased before an applied address signal may cause operation.

The foregoing and other objects of this invention are generally attained by incorporating circuitry within a monolithic ROM to create a pre-charge signal to operate such a ROM when proper biasing of all internal elements has been effected, such circuitry including monolithic field effect transistors connected to form a resistance/capacitance combination having a time constant sufficiently long to ensure proper biasing of the internal elements before an address signal may cause operation of the monolithic ROM.

BRIEF DESCRIPTION OF THE DRAWINGS

For a more complete understanding of the invention, reference is now made to the following description of the accompanying drawing, in which the single FIGURE is a simplified schematic diagram of circuitry in accordance with this invention.

DESCRIPTION OF THE PREFERRED EMBODIMENT

Before referring to the FIGURE, it will be appreciated that only the elements of the contemplated circuitry will be shown in any detail, it being deemed obvious that other elements (such as amplifiers, switches and the internal elements of a monolithic ROM) are well known in the art and are not required to be shown in detail in order that a person of ordinary skill may practice the invention. It will also be appreciated that the contemplated circuitry preferably would be fabricated as a monolithic circuit incorporated on the same substrate as the ROM with which the contemplated circuitry is to operate.

Referring now to the single FIGURE, circuitry according to the invention (sometimes referred to as a power-up precharge detector 10) is shown to include six field effect transistors (FETS Q1–Q6), each having a gate electrode (G), a source electrode (S), and a drain electrode (D). FETS Q1, Q3 and Q5 are p-channel devices and FETS Q2, Q4 and Q6 are n-channel devices. A biasing voltage, $V_{DD}$, which is the same as the biasing voltage applied to a ROM 7 and is derived from a conventional source (not shown), is applied as shown to the power-up precharge detector 10. It will be appreciated that: (a) FET Q2, connected with its S and D electrodes grounded, constitutes a capacitor; and (b), FET Q1, with its G and S electrodes short-circuited, constitutes a resistor whose resistance decreases inversely with the voltage level on the G and S electrodes. Thus, at the instant $V_{DD}$ is applied node A is effectively at ground potential. Thereafter, at a rate determined by the time constant of the series combination of FETS Q1, Q2, the voltage at node A rises exponentially toward $V_{DD}$ (less the voltage drop across FET Q1). At the instant $V_{DD}$ is applied, FETS Q3, Q5 are turned "ON" and FET Q4 remains "OFF." Therefore, the voltage at node B almost instantaneously jumps to $V_{DD}$ (less any voltage drop through FET Q3), causing FET Q6 to turn "ON" so that the voltage at node C approaches ground potential.

As the capacitor formed by the FET Q2 charges, the voltage at node A passes the threshold voltage, $V_{TH}$, of each one of the FETS Q3, Q4 to force each to switch states. That is to say, FET Q3 switches "OFF" and FET Q4 switches "ON." It should be noted here in passing that FETS Q3 and Q4 conveniently may be selected so that switching occurs when the voltage at node A approaches $V_{DD}/2$. As the FET Q4 turns "ON" and the FET Q3 turns "OFF," the voltage appearing at node B decreases. The FET Q6 then switches to "OFF" when the voltage at node B decreases to a value less than the threshold voltage, $V_{TH}$, of the FET Q6. Then, the voltage at node C almost instantaneously rises toward $V_{DD}$ (less any voltage drop in Q5). Thereafter, as long as $V_{DD}$ is applied, the extant states of the FETS Q1 . . . Q6 is maintained. That is to say, the voltage at node C remains at, essentially, $V_{DD}$. Inverter amplifier 11 provides a control signal for wired NOR gates 13, such control signal being an inverted replica of the voltage at node C so that the wired-NOR output initiates the precharge circuitry 15 for the ROM 7 when the voltage at node C is near ground potential and ends the precharge cycle to the ROM 7 when the voltage at node C is near $V_{DD}$. It will be obvious to one of skill in the art that the precharge circuit 15 may be made up of N-channel FETS (one for each bit in the address signal) connected to the output lines (not shown) of the ROM 7. The address transition detectors 17A . . . 17N are conventional, each being effective to produce a logic one signal only when the corresponding bit in the address signal changes state.

It should now be appreciated that, during the precharge period, i.e., so long as the output of the inverter 11 is at a logic one level, the level of the signal out of the wired NOR gate 13 will remain at a logic one level unless one or more of the address bits changes state during that period. With the output of the wired NOR gate 13 at a logic one level, the precharge circuit 15 is operative so that all of the output bit lines of the ROM 7 are "pulled up" to $V_{DD}$. That is to say, the address signals applied to the ROM 7 during the precharge period do not, unless a change in one (or more) of the address bits occurs during that period, control the output of the ROM 7.

What is claimed is:

1. In combination with a monolithic read only memory wherein, on start-up, elements must be biased before extant address signals are effective, the improvement comprising:
   (a) precharge circuitry connected to the output bit lines of the read only memory; and
   (b) actuating means for the precharge circuitry including monolithic circuitry for producing, when a biasing voltage is first applied and for a predetermined interval thereafter, a first signal at a logic zero level, means for inverting the first signal to a second signal at a logic one level, and logic circuits responsive to the second signal and to the extant address signals to control the precharge circuitry wherein the monolithic circuitry comprises:
      (i) a first p-channel and a first n-channel field effect transistor, each having a gate, drain and source electrode, the gate and drain electrodes of the first p-channel field effect transistor being connected so that that transistor may simulate a resistor and the source and drain electrodes of the first n-channel field effect transistor may simulate a capacitor;
      (ii) means connecting the biasing voltage to the drain electrode of the first p-channel field effect transistor, the gate and source electrodes of the first p-channel field effect transistor to the gate electrode of the first n-channel field effect transistor and the drain and the source electrodes of the first n-channel transistor to ground to produce, when the biasing voltage is first applied, a time-varying voltage at the gate electrode of the first n-channel field effect transistor, said time-varying voltage changing exponentially from ground potential to a voltage approximating the bias voltage; and
      (iii) level conversion means, responsive to the level of the time-varying voltage, to produce a voltage essentially at the bias voltage as long as the time-varying voltage is below a predetermined level intermediate ground potential and the biasing voltage and thereafter, as long as the biasing voltage is applied, a voltage at a level approximating ground potential.

2. The improvement as in claim 1 wherein the level conversion means is formed by monolithic circuitry comprising:
   (a) a second and a third p-channel field effect transistor and a second and a third n-channel field effect transistor, each one of said transistors having a gate, drain and source electrode;
   (b) means for connecting the drain electrodes of the second and the third p-channel field effect transistors to the biasing voltage and the source electrodes of the second and third p-channel field effect transistors to the drain electrodes of the second and third n-channel field effect transistors and the source electrodes of the second and third n-channel field effect transistors to ground potential;
   (c) means for connecting the gate electrodes of the second p-channel and the second n-channel field effect transistors to the gate electrode of the first n-channel field effect transistor;
   (d) means for connecting the gate electrode of the third p-chanel field effect transistor to ground potential;
   (e) means for interconnecting the source electrode of the second p-channel field effect transistor, the drain electrode of the second n-channel field effect transistor and the gate electrode of the third n-channel field effect transistor;
   (f) means for connecting the source electrode of the third p-channel field effect transistor and the drain electrode of the third n-channel field effect transistor; and
   (g) means for connecting the source electrode of the third p-channel field effect transistor to the switching means to actuate the switching means in accordance with the level of the voltage at the source electrode of the third p-channel field effect transistor.

* * * * *